(12) United States Patent
Fily et al.

(10) Patent No.: US 10,784,354 B2
(45) Date of Patent: Sep. 22, 2020

(54) TRENCHES FOR INCREASING A QUANTITY OF RELIABLE CHIPS PRODUCED FROM A WAFER

(71) Applicant: Lumentum Operations LLC, Milpitas, CA (US)

(72) Inventors: Arnaud Fily, Milpitas, CA (US); Victor Rossin, Milpitas, CA (US); David Venables, Milpitas, CA (US); Jingcong Wang, Milpitas, CA (US)

(73) Assignee: Lumentum Operations LLC, Milpitas, CA (US)

( * ) Notice: Subject to any disclaimer, the term of this patent is extended or adjusted under 35 U.S.C. 154(b) by 0 days.

(21) Appl. No.: 15/923,801

(22) Filed: Mar. 16, 2018

(65) Prior Publication Data

US 2019/0288077 A1 Sep. 19, 2019

(51) Int. Cl.

| H01L 29/32 | (2006.01) |
|---|---|
| H01S 5/02 | (2006.01) |
| H01L 21/762 | (2006.01) |
| H01S 5/183 | (2006.01) |
| H01L 29/06 | (2006.01) |
| H01L 21/82 | (2006.01) |
| H01L 21/3065 | (2006.01) |
| H01L 21/66 | (2006.01) |
| H01L 21/306 | (2006.01) |
| H01S 5/24 | (2006.01) |
| H01L 33/12 | (2010.01) |

(Continued)

(52) U.S. Cl.
CPC .......... *H01L 29/32* (2013.01); *H01L 21/3065* (2013.01); *H01L 21/30604* (2013.01); *H01L 21/762* (2013.01); *H01L 21/82* (2013.01); *H01L 22/24* (2013.01); *H01L 29/0649* (2013.01); *H01S 5/0201* (2013.01); *H01S 5/183* (2013.01); *H01S 5/18308* (2013.01); *H01S 5/24* (2013.01); *H01L 33/12* (2013.01); *H01S 5/32* (2013.01); *H01S 5/3406* (2013.01); *H01S 2301/173* (2013.01)

(58) Field of Classification Search
CPC combination set(s) only.
See application file for complete search history.

(56) References Cited

U.S. PATENT DOCUMENTS

| 6,008,131 A | 12/1999 | Chen | |
|---|---|---|---|
| 2015/0340223 A1* | 11/2015 | Wunderer | H01L 21/0254 438/492 |
| 2017/0330997 A1* | 11/2017 | Lell | H01S 5/0202 |

FOREIGN PATENT DOCUMENTS

WO 03/046980 6/2003

OTHER PUBLICATIONS

Miller et al., "GaAs Substrates for High-Power Diode Lasers", Springer-Verlag Berlin Heidelberg 2000, 51 pages.

\* cited by examiner

*Primary Examiner* — Ratisha Mehta
(74) *Attorney, Agent, or Firm* — Harrity & Harrity, LLP

(57) ABSTRACT

A light-emitting device may comprise a set of layers comprising a substrate layer, and a set of epitaxial layers deposited on the substrate layer. The set of epitaxial layers may include a strained layer. The strained layer may include a set of active zones to be used to generate optical gain. The light-emitting device may comprise a set of trenches etched into a subset of the set of layers of the light-emitting device. The set of trenches may prevent a set of defects or dislocations in a wafer from which the light-emitting device was formed from propagating into the set of active zones.

20 Claims, 15 Drawing Sheets

(51) Int. Cl.
*H01S 5/32* (2006.01)
*H01S 5/34* (2006.01)

_US 10,784,354 B2_

TRENCHES FOR INCREASING A QUANTITY OF RELIABLE CHIPS PRODUCED FROM A WAFER

TECHNICAL FIELD

The present disclosure relates to trenches etched on wafers used in the production of semiconductors and, more particularly, wafers used in the production of lasers.

BACKGROUND

In a semiconductor laser, optical gain is produced in a semiconductor material. The choice of material may depend on a desired wavelength and/or properties of a generated optical beam. In some cases, the gain medium may include, for example, a quantum heterostructure, a double heterostructure, a quantum well, a quantum wire, a quantum dot, and/or the like. A semiconductor laser may include one or more multi-layer structures.

SUMMARY

According to some possible implementations, a wafer may comprise a substrate layer. The wafer may comprise a set of epitaxial layers deposited on the substrate layer. The set of epitaxial layers may include a strained layer. The strained layer may include one or more active zones. The wafer may include one or more trenches between one or more defects or dislocations in the wafer and the one or more active zones. The one or more trenches may extend through at least the strained layer. The one or more trenches may prevent propagation of the one or more defects or dislocations into the one or more active zones.

According to some possible implementations, a method may comprise providing a wafer. The wafer may comprise a substrate layer, and a set of epitaxial layers deposited on the substrate layer. The set of epitaxial layers may include a strained layer. The strained layer may include a set of active zones to be used to generate optical gain. The method may comprise identifying a presence or a location of a set of defects or dislocations in the wafer. The method may comprise etching a set of trenches through at least the strained layer. The set of trenches may be etched between the set of defects or dislocations and the set of active zones based on the presence or the location of the set of defects or dislocations.

According to some possible implementations, a light-emitting device may comprise a set of layers comprising a substrate layer, and a set of epitaxial layers deposited on the substrate layer. The set of epitaxial layers may include a strained layer. The strained layer may include a set of active zones to be used to generate optical gain. The light-emitting device may comprise a set of trenches etched into a subset of the set of layers of the light-emitting device. The set of trenches may prevent a set of defects or dislocations in a wafer from which the light-emitting device was formed from propagating into the set of active zones.

DETAILED DESCRIPTION

The following detailed description of example implementations refers to the accompanying drawings. The same reference numbers in different drawings may identify the same or similar elements.

A wafer that is to be used to produce integrated circuits, lasers, or other devices may have defects and/or dislocations that developed during the manufacturing process of the wafer. These defects and/or dislocations may propagate along crystallographic directions once various stresses are applied to the wafer, such as after a strained layer is deposited on the wafer (e.g., due to mechanical strain on the wafer caused by the strained layer). If a defect and/or dislocation propagates through an active zone of the wafer, then a resulting chip may be defective and/or may be unusable (e.g., due to risk of the chip failing within a threshold amount of time of initial use). This reduces a quantity of reliable chips that can be produced from a wafer, thereby reducing yield associated with chip production, increasing loss associated with chip production, increasing costs associated with chip production, and/or the like.

Some implementations, described herein, provide a wafer that includes one or more trenches to reduce or eliminate defect and/or dislocation propagation through an active zone of the wafer. In this way, a quantity of reliable chips produced from a wafer may be increased. This increases yield associated with chip production, reduces loss associated with chip production, increases a reliability of a chip produced, and/or reduces costs associated with chip production, thereby improving chip production.

Figure 1:
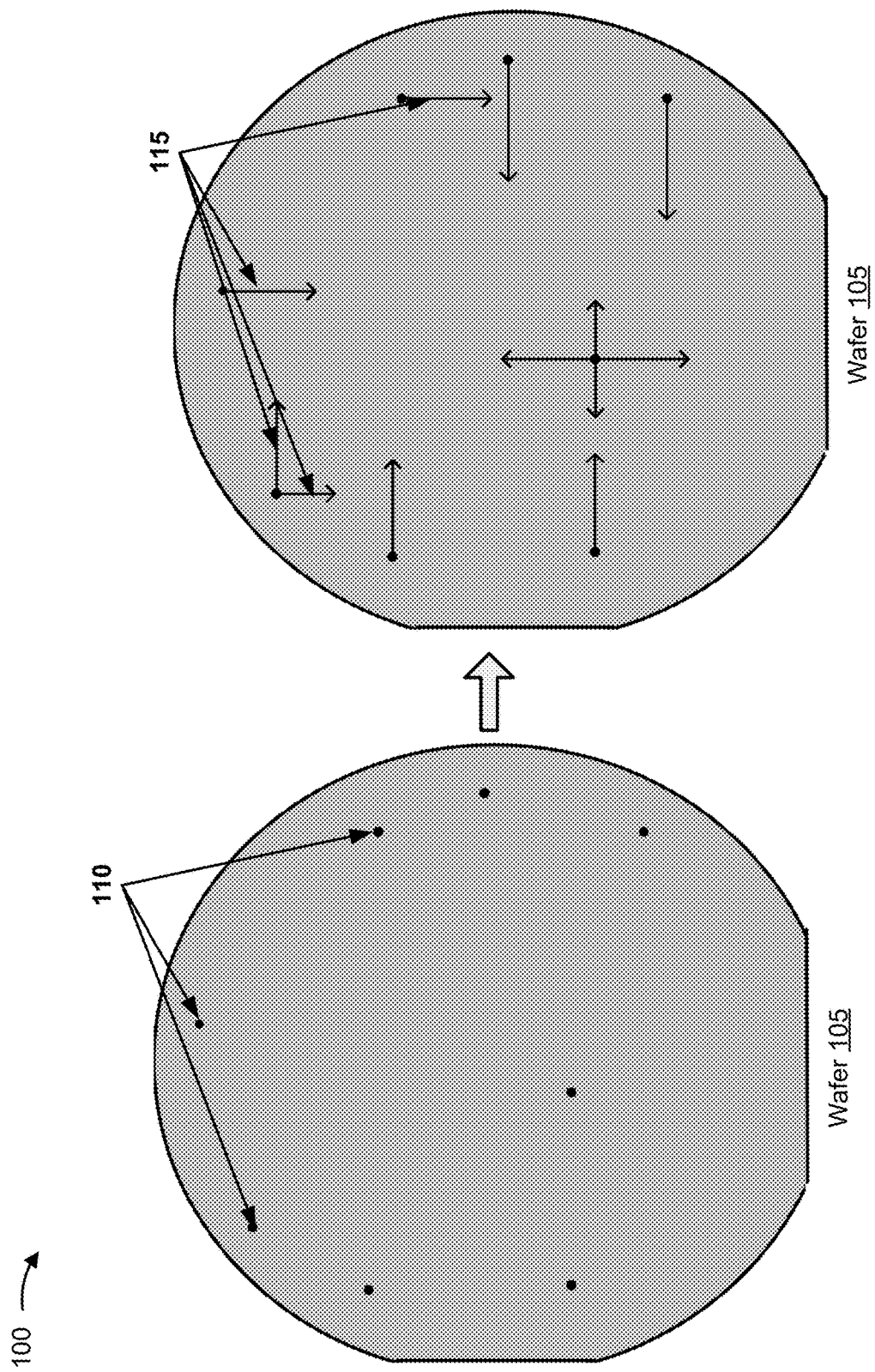
FIG. 1 is a diagram of a prior wafer that does not include a trench for increasing a quantity of reliable chips produced from the wafer.

FIG. 1 is a diagram of an example implementation 100 of a prior wafer that does not include a trench for increasing a quantity of reliable chips produced from the wafer. As shown, FIG. 1 includes wafer 105. For example, wafer 105 may be a wafer that is to be used to produce integrated circuits, chips, semiconductor lasers, and/or the like. As shown by reference number 110, and by the black dots on wafer 105, wafer 105 may include a set of defects and/or dislocations (e.g., that formed during production of wafer 105). The defects and/or dislocations may be present in any layer of wafer 105 and may have formed as a localized defect inside wafer 105 or may have formed on an external surface of wafer 105 (e.g., as a result of circularization of wafer 105 using grinding).

As shown by reference number 115, the defects and/or dislocations may propagate in various directions and for various distances through wafer 105 (e.g., due to mechanical stress on wafer 105, such as that caused by a strained layer deposited on wafer 105). For example, the defects and/or dislocations may propagate along crystallographic directions. If the defects and/or dislocations propagate through an active zone of wafer 105 (not shown in FIG. 1), the defects and/or dislocations may reduce a quantity of reliable chips that can be produced from wafer 105. During propagation, the defects and/or dislocations may terminate on an external surface of wafer 105.

As indicated above, FIG. 1 is a diagram of an example prior wafer that does not include a trench for increasing a quantity of reliable chips from the wafer. Other examples are possible and may differ from what was described with regard to FIG. 1.

Figure 2A:
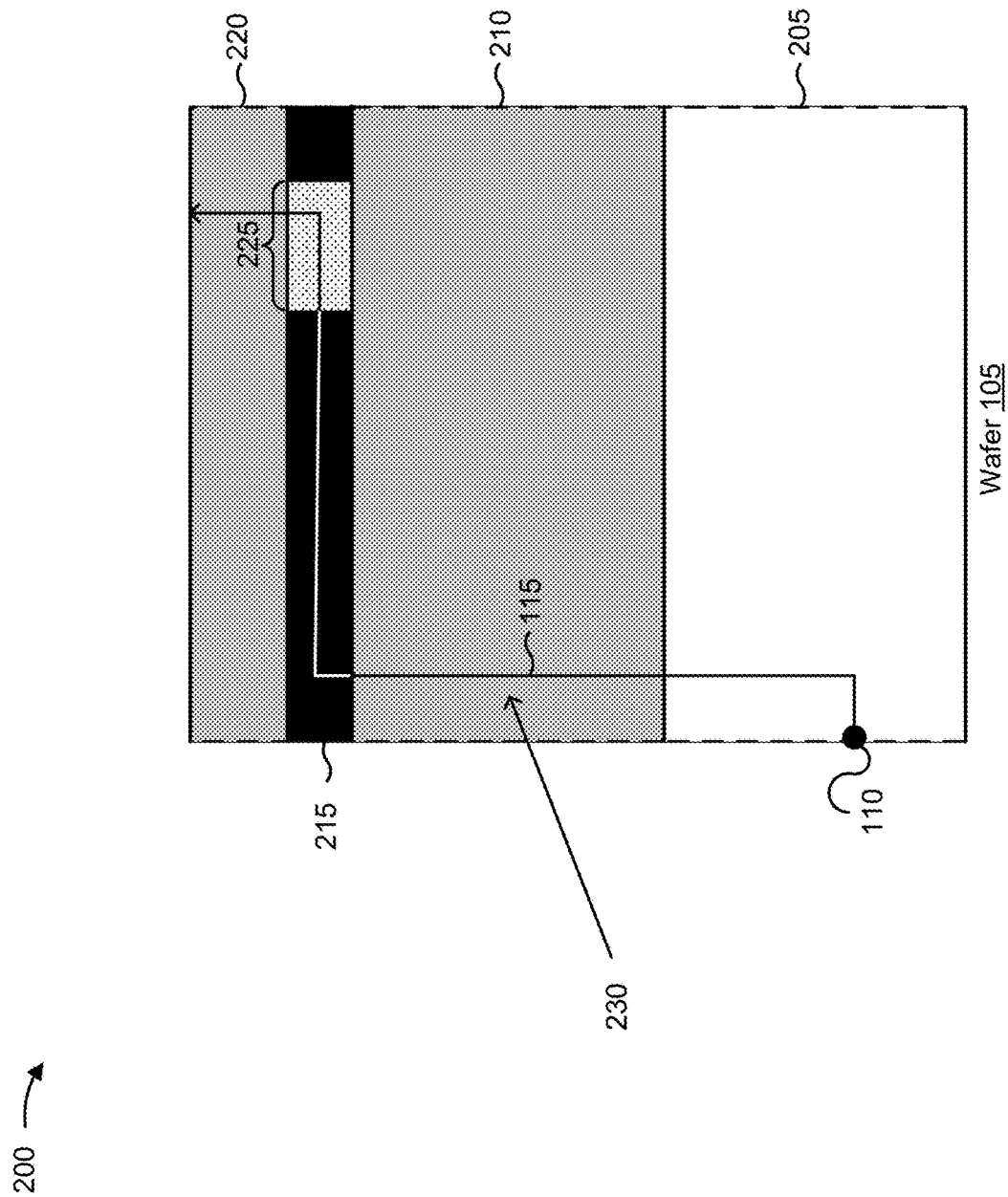
FIGS. 2A and 2B are diagrams of a prior wafer that does not include a trench for increasing a quantity of reliable chips produced from the wafer.
Figure 2B:
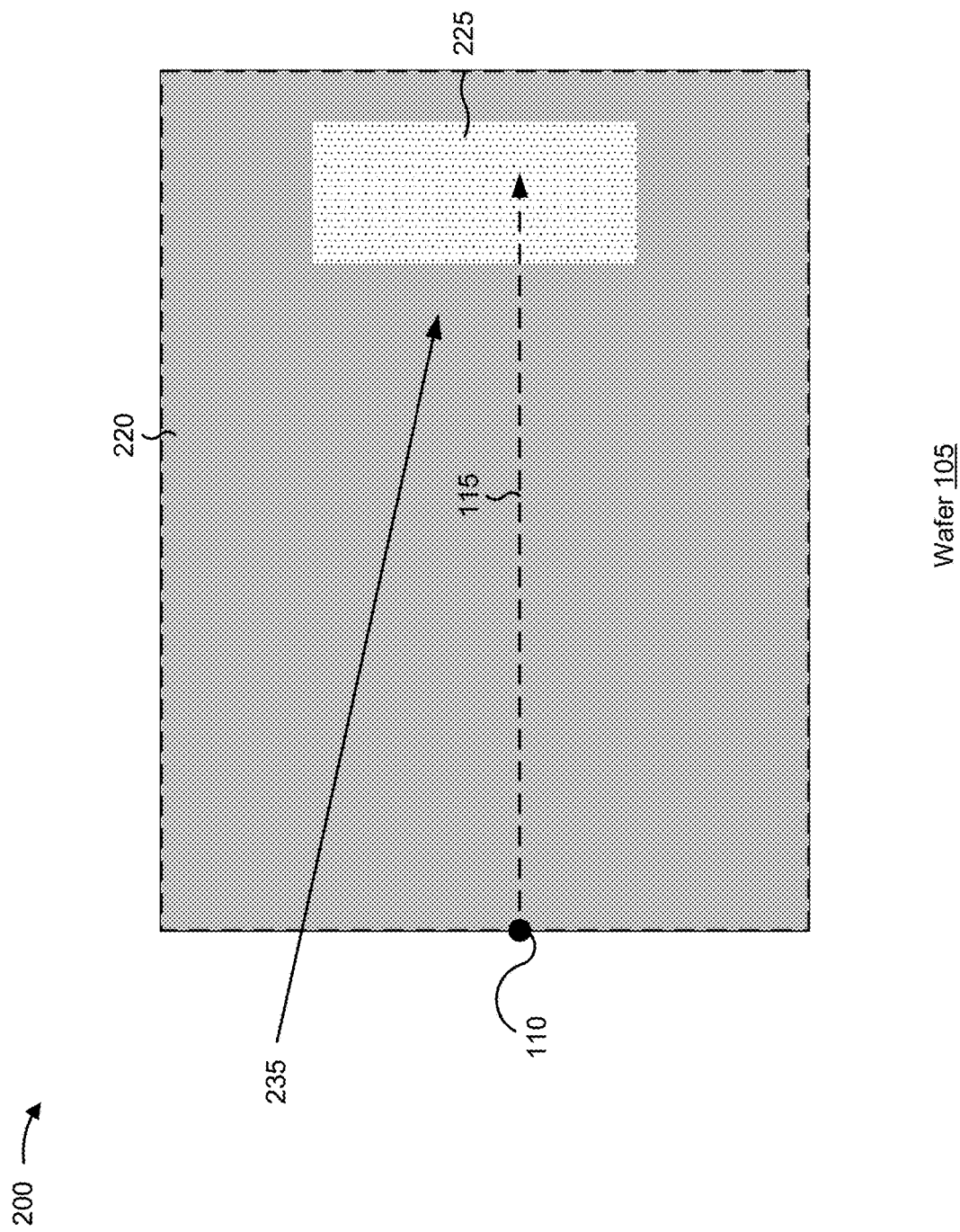

FIGS. 2A and 2B are diagrams of an example implementation 200 of a prior wafer (e.g., wafer 105) that does not include a trench for increasing a quantity of reliable chips from the wafer. FIGS. 2A and 2B show a cross-section view and a top-view, respectively, of various layers of wafer 105. In addition, FIGS. 2A and 2B show a portion of wafer 105, rather than an entirety of wafer 105 (as indicated by the dashed outline of wafer 105).

As shown in FIG. 2A, and by reference numbers 205 through 220, wafer 105 may include various layers. For example, wafer 105 may include a substrate layer 205, and a set of epitaxial layers, such as a layer 210 deposited on substrate layer 205, a strained layer 215 deposited on layer 210, and a surface layer 220 deposited on strained layer 215 (e.g., another epitaxial layer, a p-doped side of a p-n junction, a cladding, or mirror, layer of a three layer waveguide structure, etc.). In some implementations, layer 210 and/or surface layer 220 may be strained layers, similar to strained layer 215. Further, strained layer 215 may include multiple layers (e.g., in the case of a quantum well).

As further shown, wafer 105 may include an active zone 225 in strained layer 215. For example, active zone 225 may include an area of wafer 105 to be used to generate optical gain for a laser, such as a quantum well laser, a quantum dot laser, a double heterostructure laser, and/or the like. In other words, active zone 225 may include a portion of an active layer (e.g., a portion of strained layer 215) that is to be used to generate optical gain for a laser. In some implementations, active zone 225 may include multiple active zones 225 and/or a set of portions of wafer 105 to be used as a set of active zones 225.

As shown by reference number 230, a defect and/or dislocation in substrate layer 205 (shown by reference number 110) may propagate vertically from substrate layer 205 through layer 210 and into strained layer 215, laterally through strained layer 215 into active zone 225, and then vertically through surface layer 220. In this way, a defect and/or dislocation may propagate through various portions of wafer 105 and may reduce a reliability of a chip produced from wafer 105 and/or may reduce a quantity of reliable chips produced from wafer 105, thereby increasing loss associated with chip production, increasing costs associated with chip production, and/or the like.

FIG. 2B shows a top-view of wafer 105 and the propagation of the defect and/or dislocation (shown by reference number 110). As shown by reference number 235, the defect and/or dislocation may propagate laterally through various layers of wafer 105 (shown using a dotted line), during which the defect and/or dislocation may intersect active zone 225. Based on propagating through active zone 225, the defect and/or dislocation may reduce a quantity of reliable chips that may be produced from wafer 105 and/or may reduce a reliability of a chip produced from wafer 105, thereby increasing loss associated with chip production, increasing costs associated with chip production, and/or the like.

As indicated above, FIGS. 2A and 2B are diagrams of an example prior wafer that does not include a trench for increasing a quantity of reliable chips produced from a wafer. Other examples are possible and may differ from what was described with regard to FIGS. 2A and 2B.

Figure 3A:
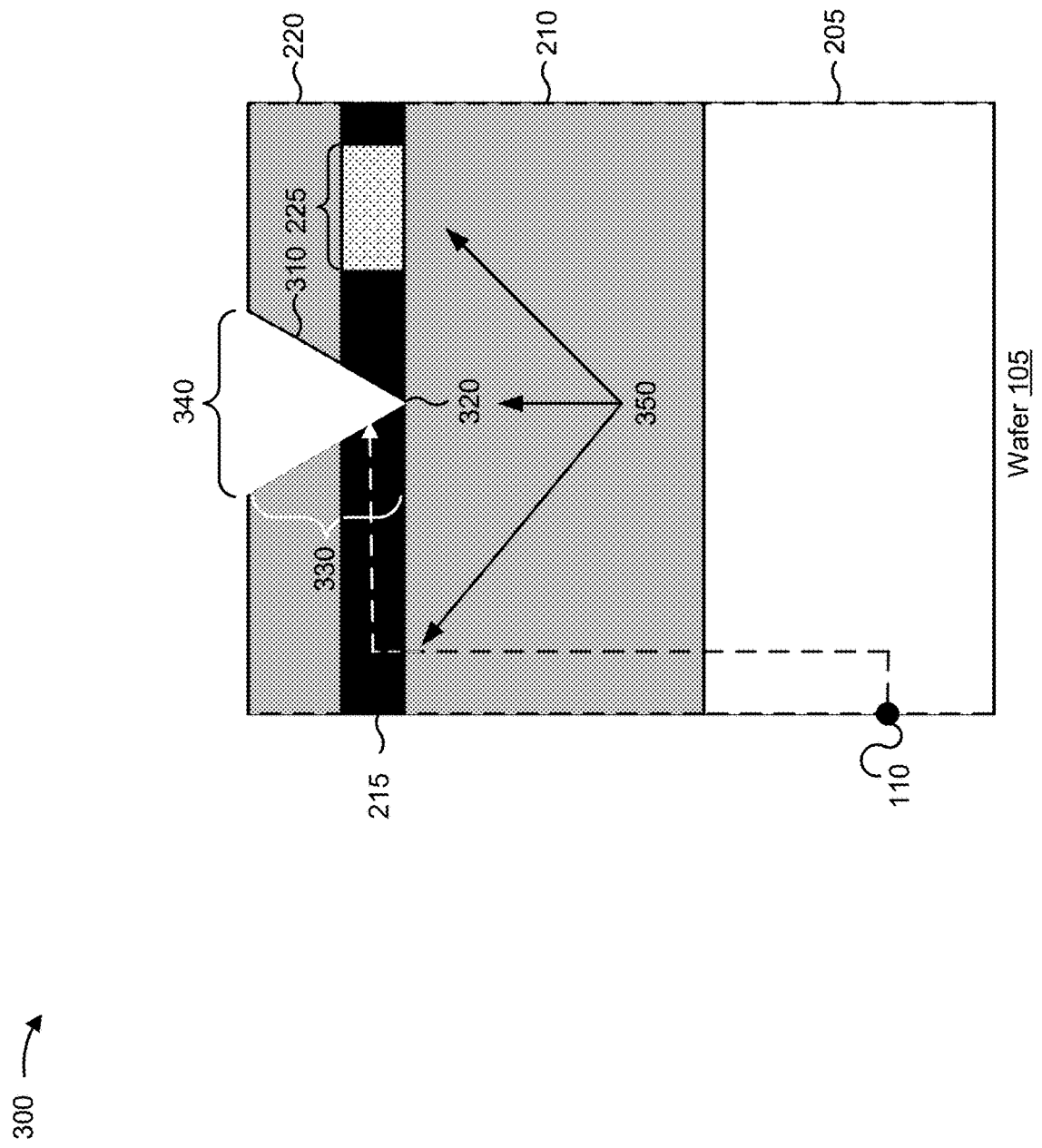
FIGS. 3A and 3B are diagrams of an overview of an example implementation of a wafer that includes a trench for increasing a quantity of reliable chips produced from the wafer described herein.
Figure 3B:
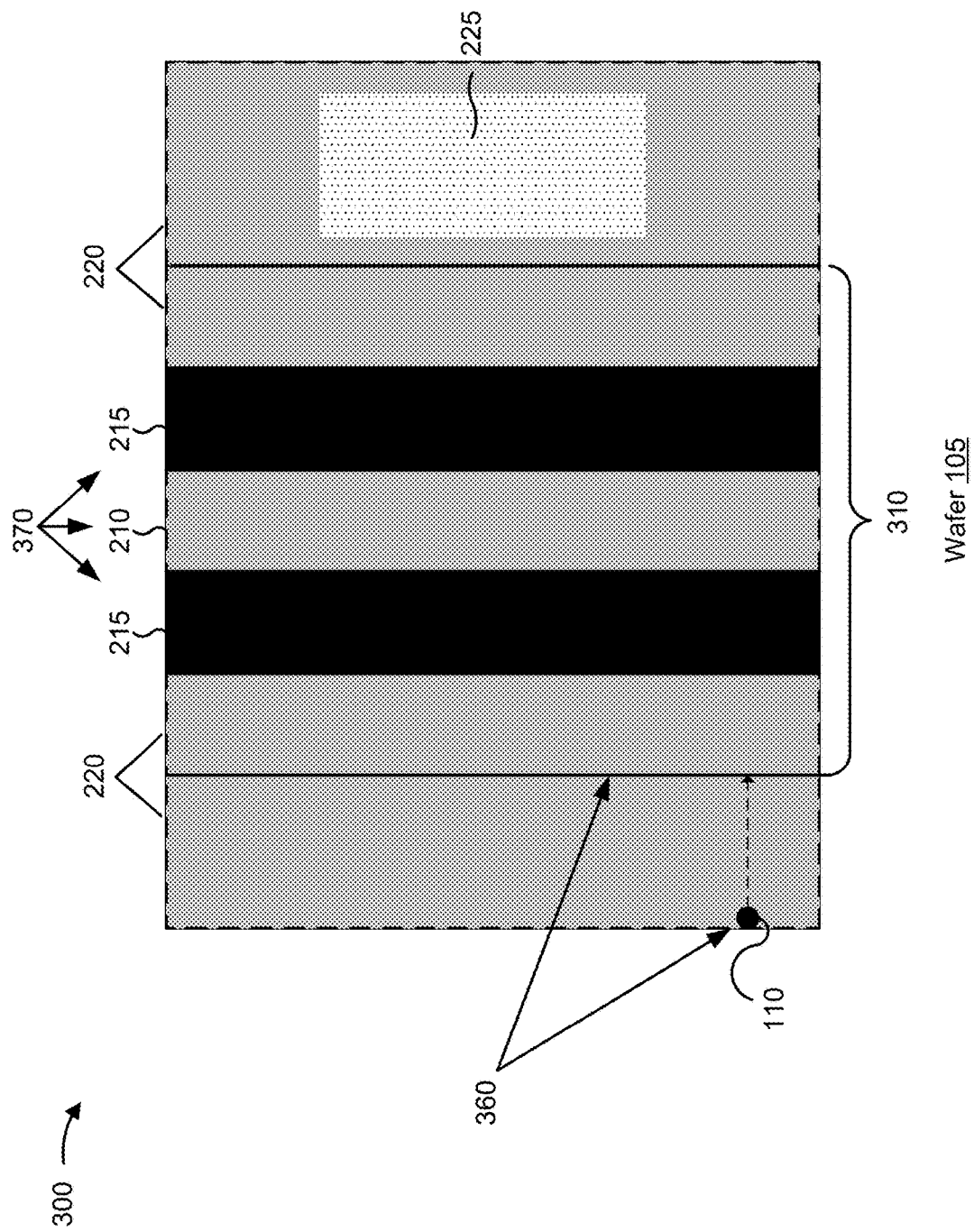

FIGS. 3A and 3B are diagrams of an overview of an example implementation 300 of a wafer that includes a trench for increasing a quantity of reliable chips produced from the wafer. For example, FIGS. 3A and 3B show a cross-section view and a top-view, respectively, of various layers of wafer 105. In addition, FIGS. 3A and 3B show a portion of wafer 105 rather than an entirety of wafer 105 (as indicated by the dashed outline of wafer 105).

As shown in FIG. 3A, wafer 105 may include a trench 310. Trench 310 may extend from a surface of wafer 105 into a set of layers (e.g., set of layers 210, 215 and 220) of wafer 105. For example, and as shown by reference number 320, trench 310 may extend from a surface of wafer 105 through at least strained layer 215. By having trench 310 extend through strained layer 215, trench 310 may prevent lateral propagation of a defect and/or dislocation into active zone 225. For example, a defect and/or dislocation may propagate laterally through strained layer 215 more easily relative to other layers of wafer 105 due to the mechanical stress applied by strained layer 215.

As shown by reference number 330, trench 310 may extend to a depth through wafer 105. For example, when trench 310 extends through strained layer 215, trench 310 may extend to a depth of approximately one micrometer (μm) (e.g., one micron). In some implementations, trench 310 may extend through at least strained layer 215. This reduces or eliminates a likelihood that a defect will propagate under trench 310. In some implementations, trench 310 may extend into substrate layer 205. As shown by reference number 340, trench 310 may have a width. For example, trench 310 may have a width of approximately 1 to 20 microns.

In some cases, a depth of trench 310 may depend on a technique used to form trench 310, a thickness of the various layers of wafer 105, and/or the like. In addition, a width of trench 310 may depend on a depth of trench 310, a technique used to form trench 310, and/or the like. As such, any ranges of values for a depth and/or width of trench 310 provided herein are provided merely as examples and are not intended to limit the implementations described herein to such ranges of values.

In some cases, trench 310 may have a shape other than a "V" shape with a pointed bottom, as is shown in FIGS. 3A and 3B, and elsewhere herein. For example, trench 310 may have a rounded bottom shape (e.g., a "U" shape), a flat bottom shape, and/or the like. In addition, the walls of trench 310 may have an angle of inclination that is steeper or shallower than what is shown in FIGS. 3A and 3B, and elsewhere herein.

As shown by reference number 350, trench 310 may be positioned on wafer 105 such that trench 310 is located between active zone 225 and a corresponding vertical translation of a location of a defect and/or dislocation through the layers of wafer 105 (e.g., shown by the dotted line). Positioning trench 310 in this manner may protect active zone 225 from lateral propagation of a defect and/or dislocation through strained layer 215 into active zone 225. In addition, trench 310 may be positioned a threshold distance (e.g. five microns to 10 microns) from active zone 225 (e.g., to reduce or eliminate damage to active zone 225 that can result from etching of trench 310 and/or reduced structural integrity of wafer 105 due to a presence of trench 310 in wafer 105). For example, trench 310 may be positioned at least five microns from active zone 225 (e.g., between five and 10 microns from active zone 225).

FIG. 3B shows a top-view of wafer 105 and trench 310. As shown by reference number 360, trench 310 is positioned between active zone 225 and a corresponding vertical translation of a location of a defect and/or dislocation. As shown by reference number 370, trench 310 extends through strained layer 215 and into layer 210 (shown as a gray stripe between the two black stripes). This prevents a defect and/or dislocation from propagating laterally through strained layer 215 into active zone 225, thereby reducing or eliminating damage to active zone 225 from the defect and/or dislocation. In addition, by having trench 310 extend into layer 210, trench 310 prevents lateral propagation of a defect and/or dislocation through strained layer 215 and under trench 310.

In this way, a quantity of reliable chips produced from wafer 105 may be increased. This increases a yield associated with chip production, reduces loss associated with chip production, and/or reduces costs associated with chip production, thereby improving chip production.

In this way, a quantity of reliable chips produced from wafer 105 may be increased via use of trench 310 that reduces or eliminates propagation of a defect and/or dislocation through wafer 105. This increases yield associated with chip production, reduces loss associated with chip production, increases a reliability of a chip produced, and/or reduces costs associated with chip production, thereby improving chip production.

As indicated above, FIGS. 3A and 3B are provided merely as an example. Other examples are possible and may differ from what was described with regard to FIGS. 3A and 3B. The heights, widths, and thicknesses of layers and/or other features (e.g., active zone 225, trench 310, etc.) shown in FIGS. 3A and 3B are provided as examples, and are exaggerated for illustrative purposes. Further, wafer 105 may include additional layers and/or features, fewer layers and/or features, different layers and/or features, or differently arranged layers and/or features than those shown in FIGS. 3A and 3B.

FIGS. 4A-4D are diagrams depicting top-views of example implementations 400 of a wafer with a trench for increasing a quantity of reliable chips produced from the wafer. For example, FIGS. 4A-4D show wafer 105 with various implementations that include sets of trenches 310 formed between a set of active zones 225. In some implementations, active zone 225 may be associated with one or more chips. Additionally, or alternatively, a chip may include one or more active zones 225. In some implementations, wafer 105 may include multiple chips and/or multiple chip layouts. To keep the figures simple to understand, chips are not illustrated in the figures.

Figure 4A:
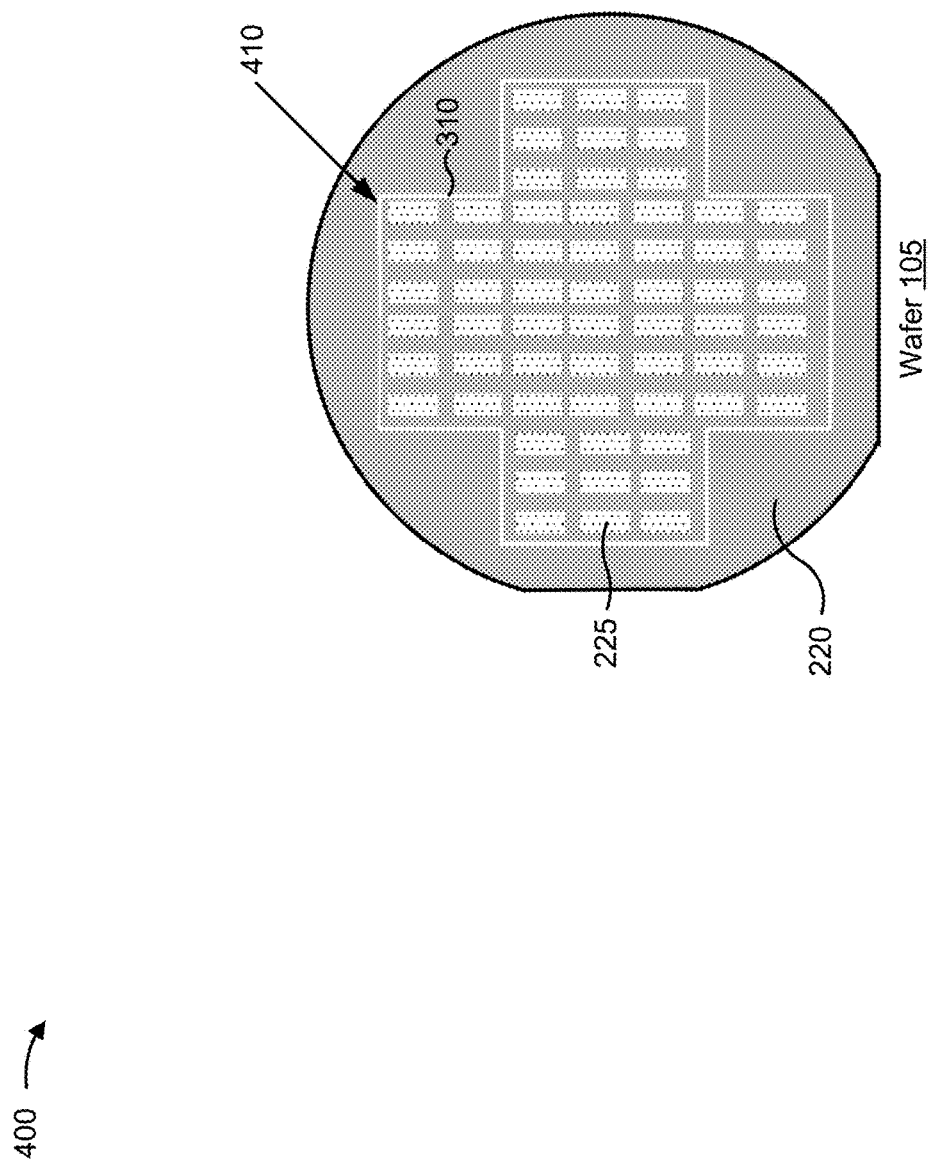
FIGS. 4A-4D are diagrams depicting top-views of example implementations of a wafer that includes a trench for increasing a quantity of reliable chips produced from the wafer described herein.

As shown in FIG. 4A, and by reference number 410, a set of trenches 310 may extend around a set of active zones 225 (e.g., shown as white rectangles with black dots). For example, the set of trenches 310 may extend around the set of active zones 225 a threshold distance from the set of active zones 225 (e.g., proximate or near to the set of active zones 225, such as at least approximately five to 10 microns from active zone 225). In this way, a set of trenches 310 may isolate a set of active zones 225 from other portions of wafer 105 that may include defects and/or dislocations (e.g., unused portions of wafer 105). Having the set of trenches 310 extend around the set of active zones 225 in this manner may reduce or eliminate a need to identify a location of defects and/or dislocations in wafer 105 prior to etching the set of trenches 310 or determining a location for the set of trenches 310. This conserves resources that would otherwise be consumed identifying a location of a set of defects and/or dislocations in wafer 105 prior to etching a set of trenches 310.

In some implementations, the set of trenches 310 may include a single trench 310 that extends around the set of active zones 225. Conversely, in some implementations, the set of trenches 310 may include multiple trenches 310 that are positioned at various locations around the set of active zones 225.

Figure 4B:
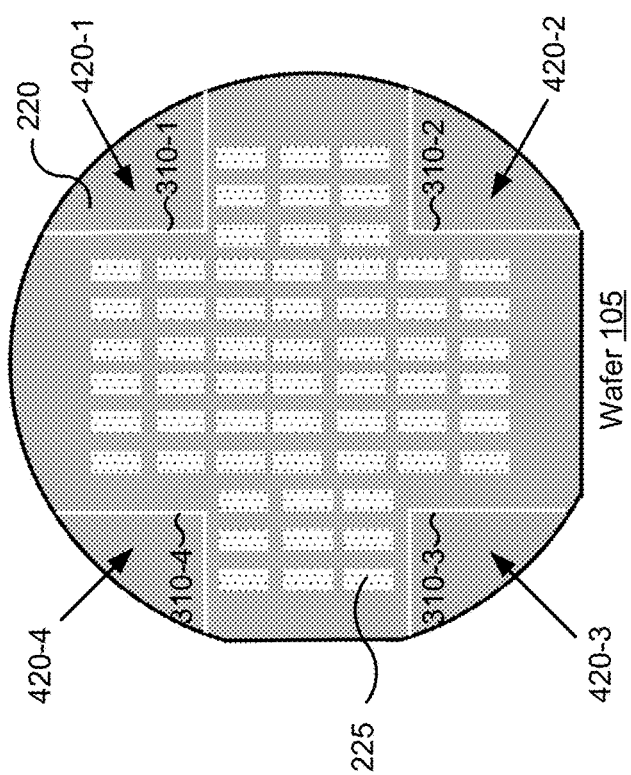

As shown in FIG. 4B, and by reference numbers 420-1 through 420-4, trenches 310-1 through 310-4 may extend between the set of active zones and a set of portions of wafer 105 (e.g., a set of portions that includes a set of defects and/or dislocations), rather than extending around the set of active zones, as was described with respect to reference number 410. For example, trenches 310-1 through 310-4 may be located a threshold distance from the set of portions of wafer 105 that includes the set of defects and/or dislocations (e.g., trenches 310-1 through 310-4 may be located proximate to, or near, the set of defects and/or dislocations, such as at least approximately 5 to 10 microns from the set of defects and/or dislocations). In this way, a set of trenches 310 may isolate a set of portions of wafer 105 that includes a set of defects and/or dislocations, such that propagation of the set of defects and/or dislocations to other portions of wafer 105 (e.g., to the set of active zones) is reduced or eliminated.

Having trenches 310-1 through 310-4 extend between the set of active zones 225 and a set of portions of wafer 105 in this manner may reduce a quantity of trenches 310 needed and/or a total length of trenches 310 etched into wafer 105, thereby conserving resources associated with etching trenches 310. In addition, this may reduce a risk of damage to the set of active zones 225 that may occur during etching of trenches 310-1 through 310-4 by permitting trenches 310-1 through 310-4 to be etched further from the set of active zones 225 relative to when a set of trenches 310 is etched around the set of active zones 225, as described with respect to reference number 410. In some implementations, each of trenches 310-1 through 310-4 may include a single trench 310. Conversely, in some implementations, each of trenches 310-1 through 310-4 may include multiple trenches 310.

Figure 4C:
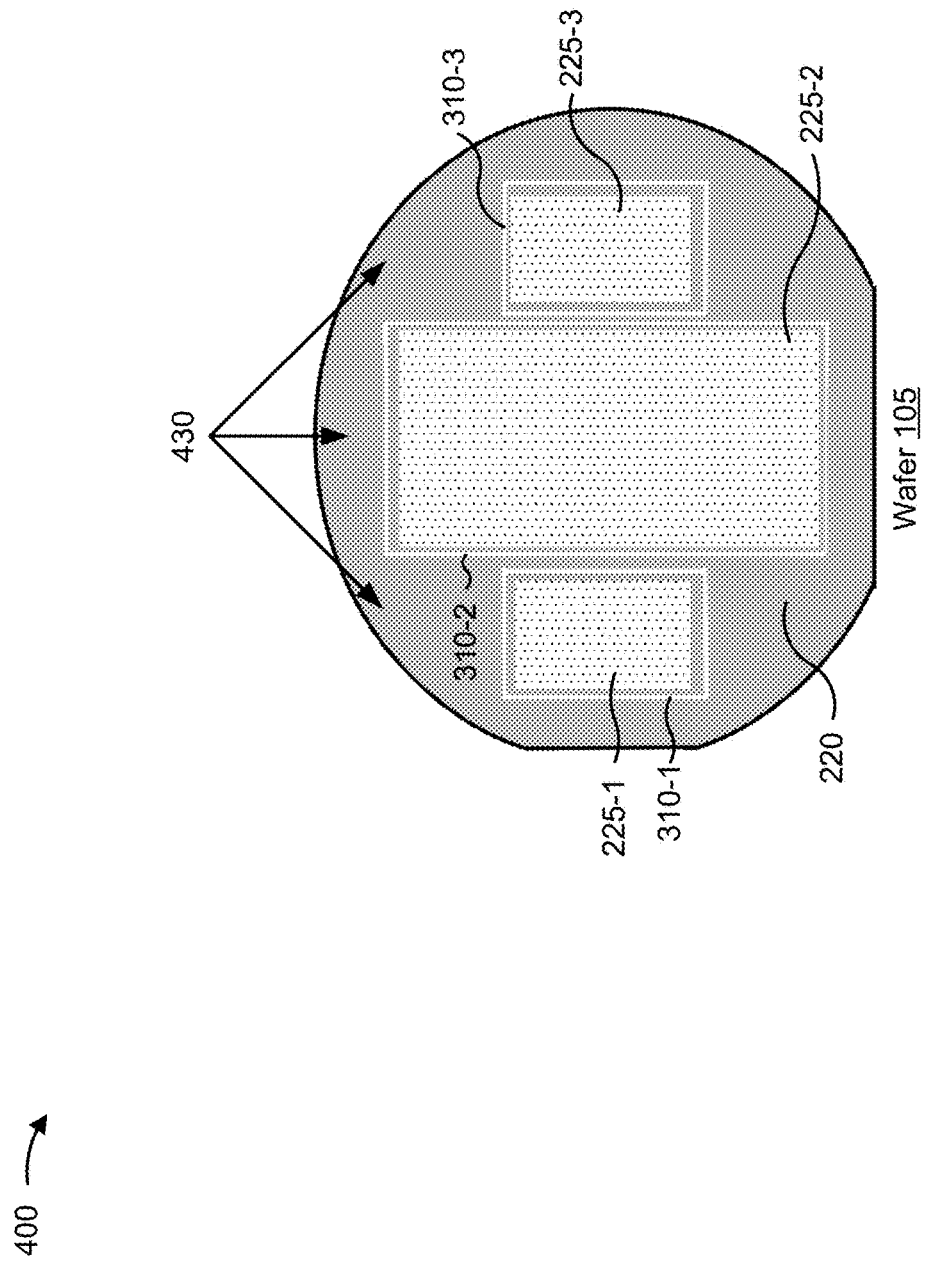

For FIG. 4C, the set of active zones 225 are shown differently from FIGS. 4A, 4B, and 4C for explanatory purposes. In addition, for explanatory purposes, FIG. 4C shows three active zones 225 (e.g., active zones 225-1 through 225-3). As shown in FIG. 4C, and by reference number 430, trenches 310-1 through 310-3 may extend around corresponding, individual active zones 225-1 through 225-3, in a manner similar to that described above with respect to reference number 410. Having trenches 310-1 through 310-3 extend around individual active zones 225-1 through 225-3, rather than having a set of trenches 310 extend around active zones 225-1 through 225-3 collectively, similar to what was described with respect to reference number 410, may further isolate active zones 225-1 through 225-3 from other portions of wafer 105 that may include a set of defects and/or dislocations. This may further increase a quantity of reliable chips produced from wafer 105, increase a yield of chip production, and/or the like. In some implementations, trenches 310-1 through 310-4 may be located a threshold distance from active zones 225-1 through 225-3, similar to that described above with respect to FIG. 4A (e.g., at least approximately five to 10 microns from active zones 225-1 through 225-3).

Figure 4D:
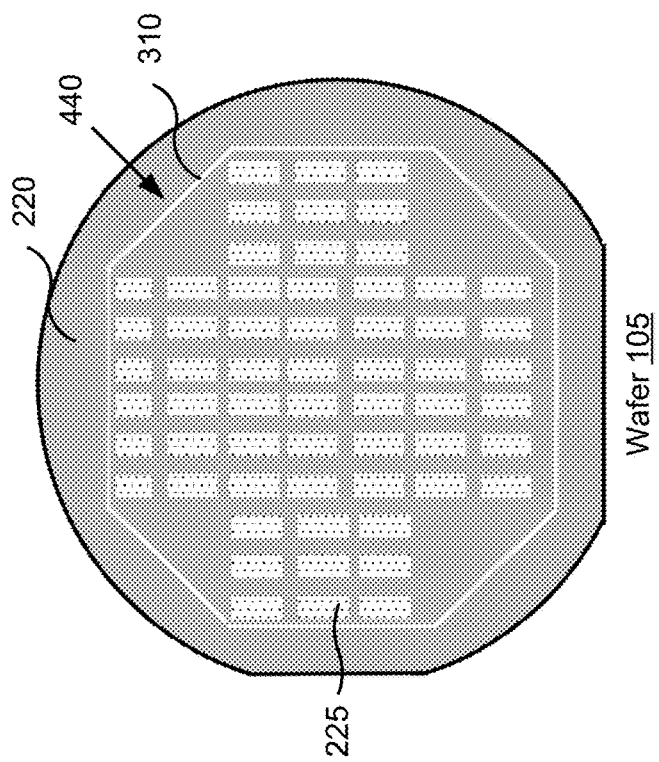

As shown in FIG. 4D, and by reference number 440, trench 310 may extend in various directions. For example, trench 310 may extend in a crystallographic direction (e.g., toward a left or right side of FIG. 4D and/or toward a top or bottom side of FIG. 4D), in a direction other than a crystallographic direction (e.g., at an angle to a crystallographic direction), in straight manner, in a curved manner, in a combination of straight and curved manners, and/or the like. In this way, trench 310 may extend around a set of active zones 225, between a set of active zones 225 and other portions of wafer 105, and/or the like depending on a location of a set of defects and/or dislocations in wafer 105, a size and/or location of a set of active zones 225, and/or the like. This improves protection of a set of active zones 225 relative to a set of trenches 310 that extends in a limited set of directions and/or manners (e.g., a set of trenches 310 that extends in a crystallographic direction and/or in a straight manner) by permitting flexibility with respect to a location and/or design of a set of trenches 310. As shown by reference numbers 410 thorough 440, a set of trenches 310 that is used to increase a quantity of reliable chips produced from wafer 105 may not extend through a set of active zones 225.

As indicated above, FIGS. 4A-4D are provided merely as an example. Other examples are possible and may differ from what was described with regard to FIGS. 4A-4D. The heights, widths, and thicknesses of layers and/or other features shown in FIGS. 4A-4D are provided as examples, and are exaggerated for illustrative purposes. Further, wafer 105 may include additional layers and/or features, fewer layers and/or features, different layers and/or features, or differently arranged layers and/or features than those shown in FIGS. 4A-4D.

Figure 5A:
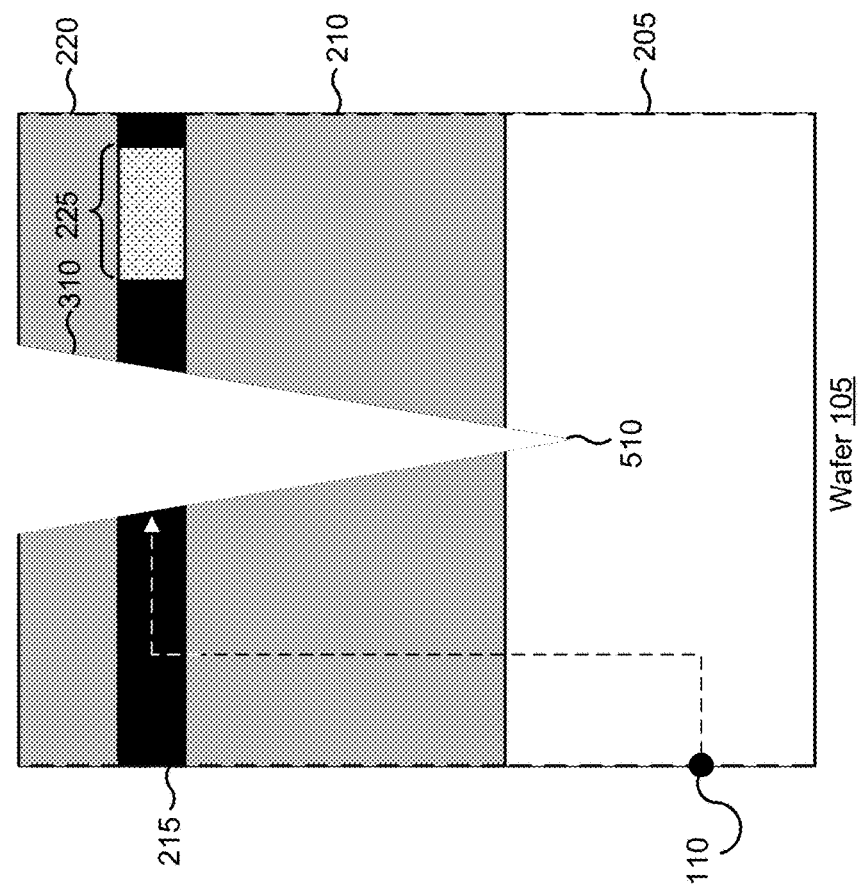
FIGS. 5A and 5B are diagrams of an overview of an example implementation of a wafer that includes a trench for increasing a quantity of reliable chips produced from the wafer described herein.
Figure 5B:
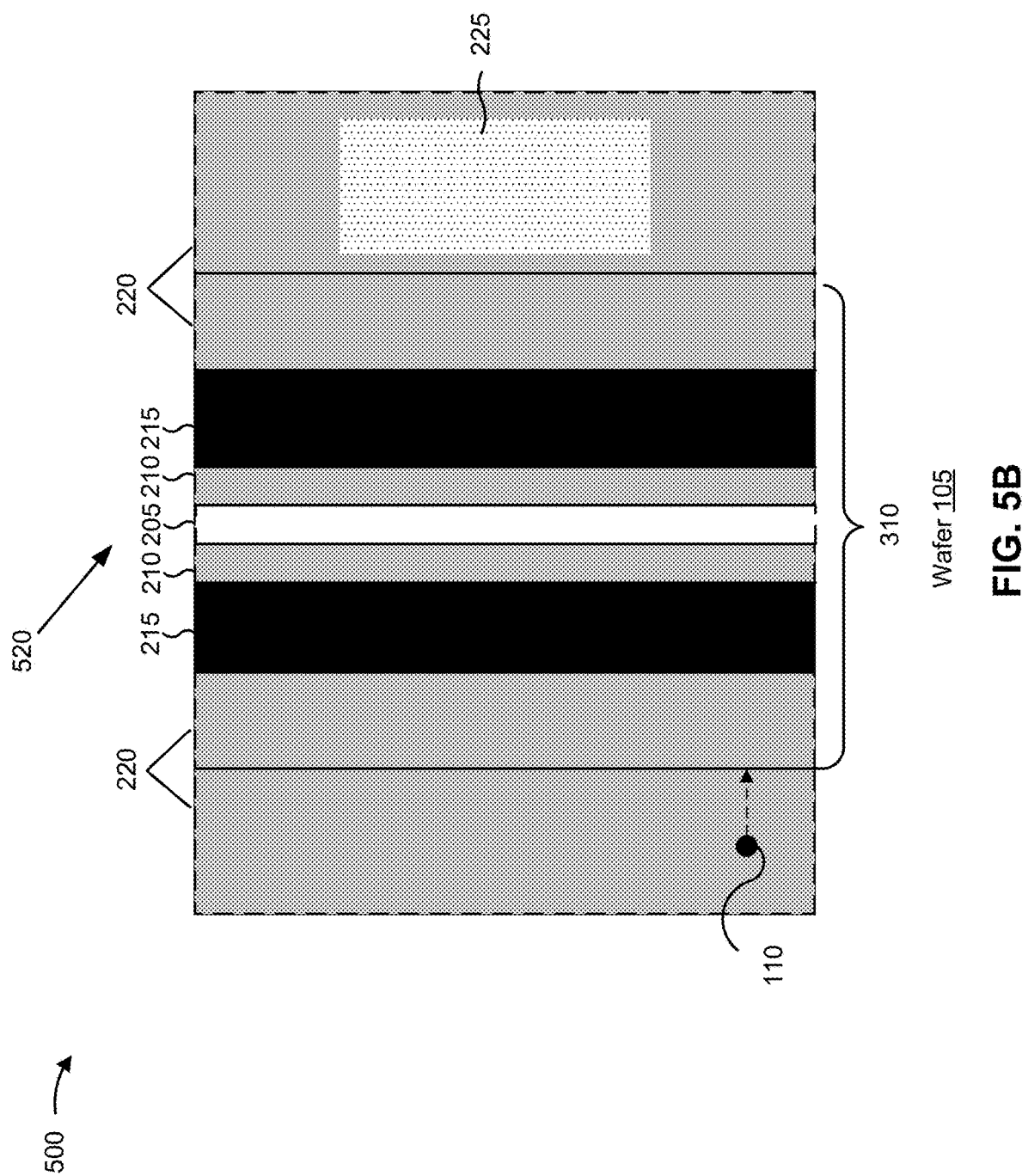

FIGS. 5A and 5B are diagrams of an overview of an example implementation 500 of a wafer that includes a set of layers (e.g., a set of epitaxial layers) and a trench for increasing a quantity of reliable chips produced from the wafer. FIGS. 5A and 5B show a cross-section view and a top-view, respectively, of various layers of wafer 105. FIGS. 5A and 5B show a portion of wafer 105 rather than an entirety of wafer 105 (as indicated by the dashed outline of wafer 105).

As shown in FIG. 5A, and by reference number 510, trench 310 may extend through layer 210 and into substrate layer 205 (e.g., rather than merely extending through strained layer 215 as was described with respect to FIGS. 3A and 3B). For example, trench 310 may extend through one or more layers on which strained layer 215 is deposited. By extending through layer 210, trench 310 may further reduce or eliminate propagation of a defect and/or dislocation (shown by reference number 110) laterally into active zone 225, relative to when trench 310 merely extends through strained layer 215.

For example, a likelihood of a defect and/or dislocation propagating laterally beneath trench 310 may be reduced when trench 310 extends through layer 210, relative to when trench 310 merely extends through strained layer 215 due to trench 310 extending deeper through wafer 105. In other words, trench 310 extending through layer 210 reduces or eliminates a risk that a defect and/or dislocation will propagate laterally beneath trench 310, relative to having a shallower trench 310 that merely extends through strained layer 215. In this case, for example, trench 310 may extend through wafer 105 to a depth of no more than approximately five to six microns.

FIG. 5B shows a top view of wafer 105. As shown in FIG. 5B, and by reference number 520, trench 310 may extend through layer 210 into substrate layer 205 (e.g., shown as a white stripe between the two gray stripes associated with reference number 210). As further shown in FIG. 5B, trench 310 may be positioned between active zone 225 and a defect and/or dislocation in wafer 105 (shown by reference number 110), in a manner similar to that described elsewhere herein. This may prevent a defect and/or dislocation from propagating laterally through layers of wafer 105 into active zone 225, thereby reducing or eliminating damage to active zone 225 from the defect and/or dislocation and increasing a quantity of reliable chips produced from wafer 105.

As indicated above, FIGS. 5A and 5B are provided merely as an example. Other examples are possible and may differ from what was described with regard to FIGS. 5A and 5B. The heights, widths, and thicknesses of layers and/or other features shown in FIGS. 5A and 5B are provided as examples, and are exaggerated for illustrative purposes. Further, wafer 105 may include additional layers and/or features, fewer layers and/or features, different layers and/or features, or differently arranged layers and/or features than those shown in FIGS. 5A and 5B.

Figure 6A:
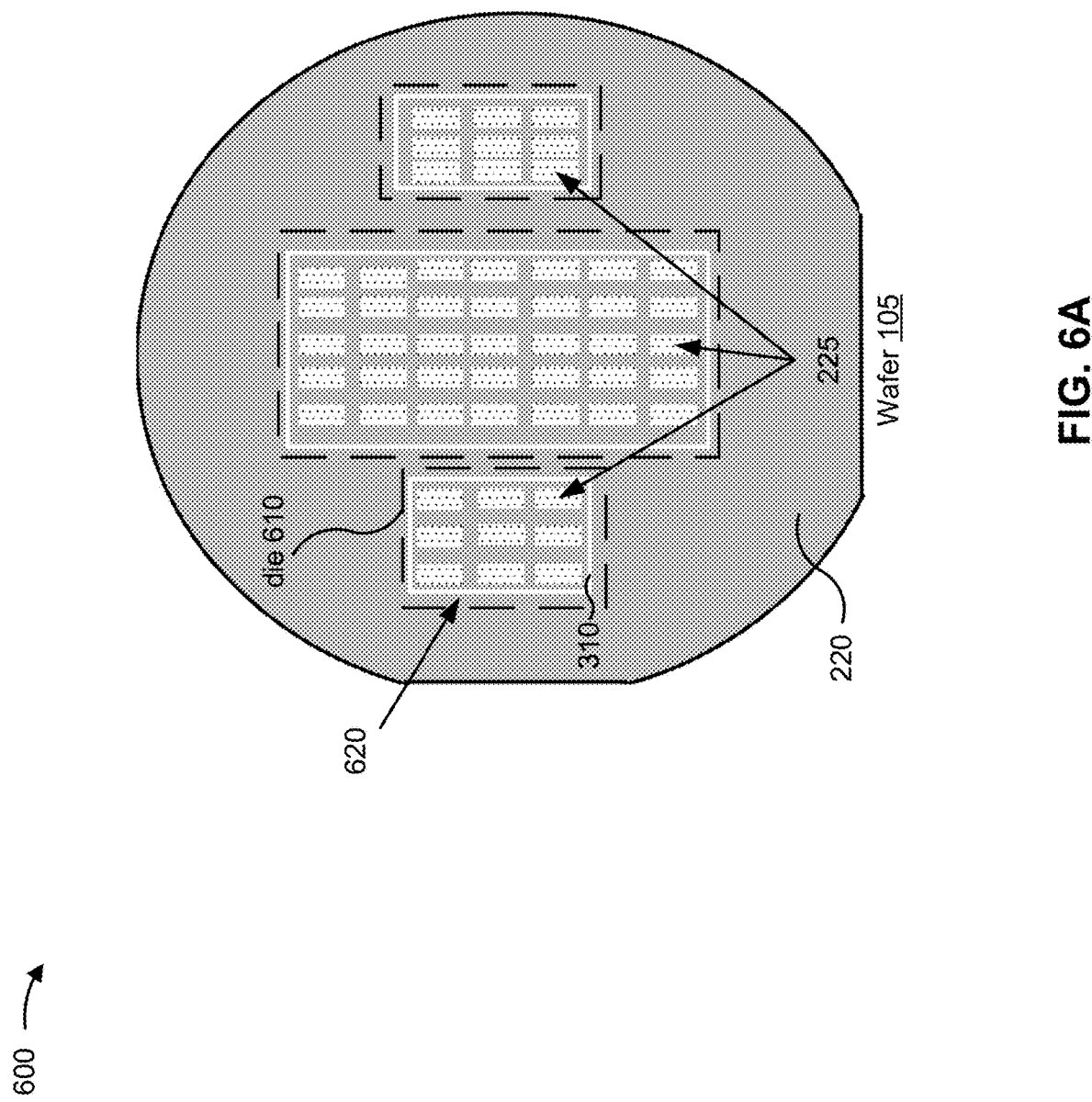
FIGS. 6A-6C are diagrams depicting top-views of example implementations of a wafer that includes a trench for increasing a quantity of reliable chips produced from the wafer described herein.
Figure 6B:
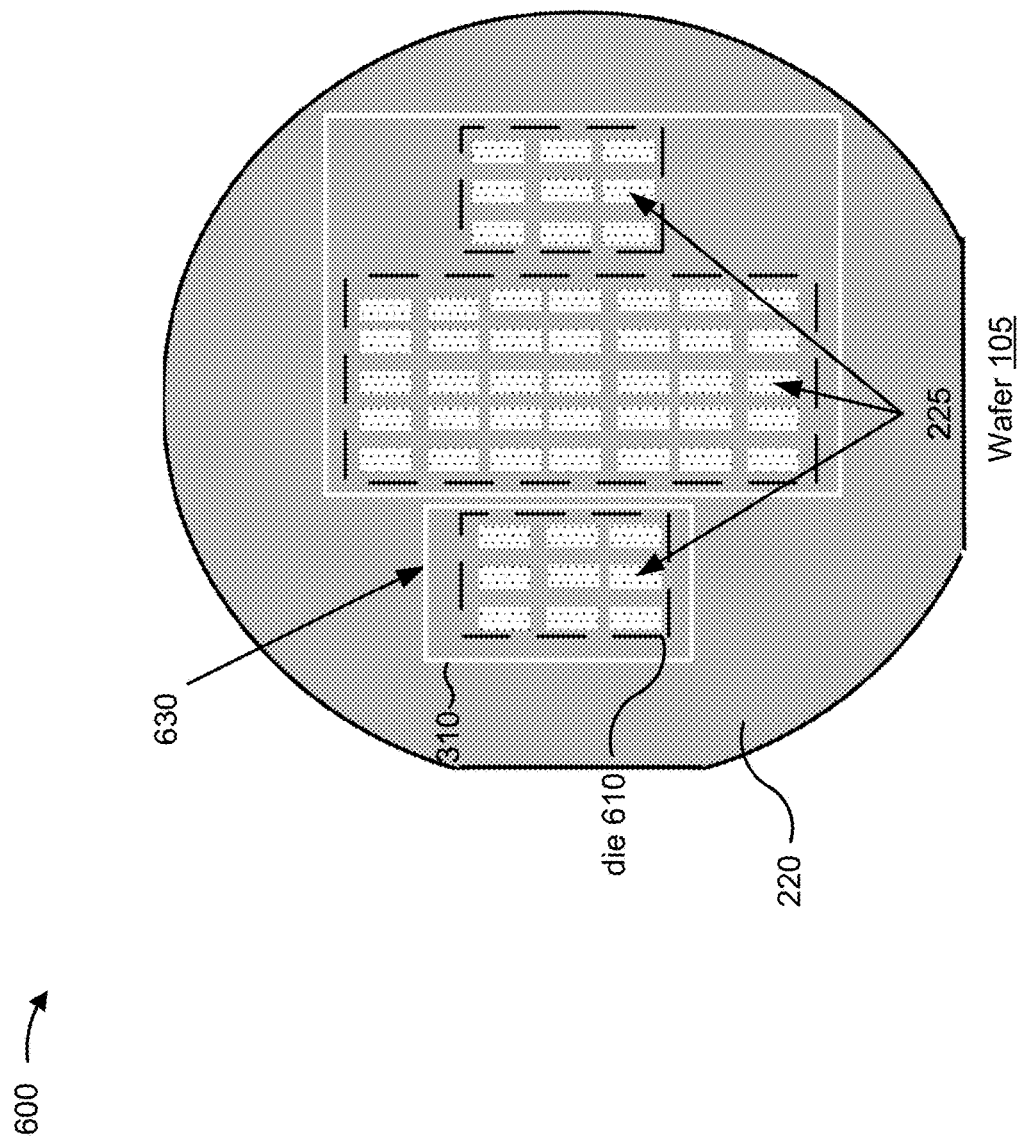
Figure 6C:
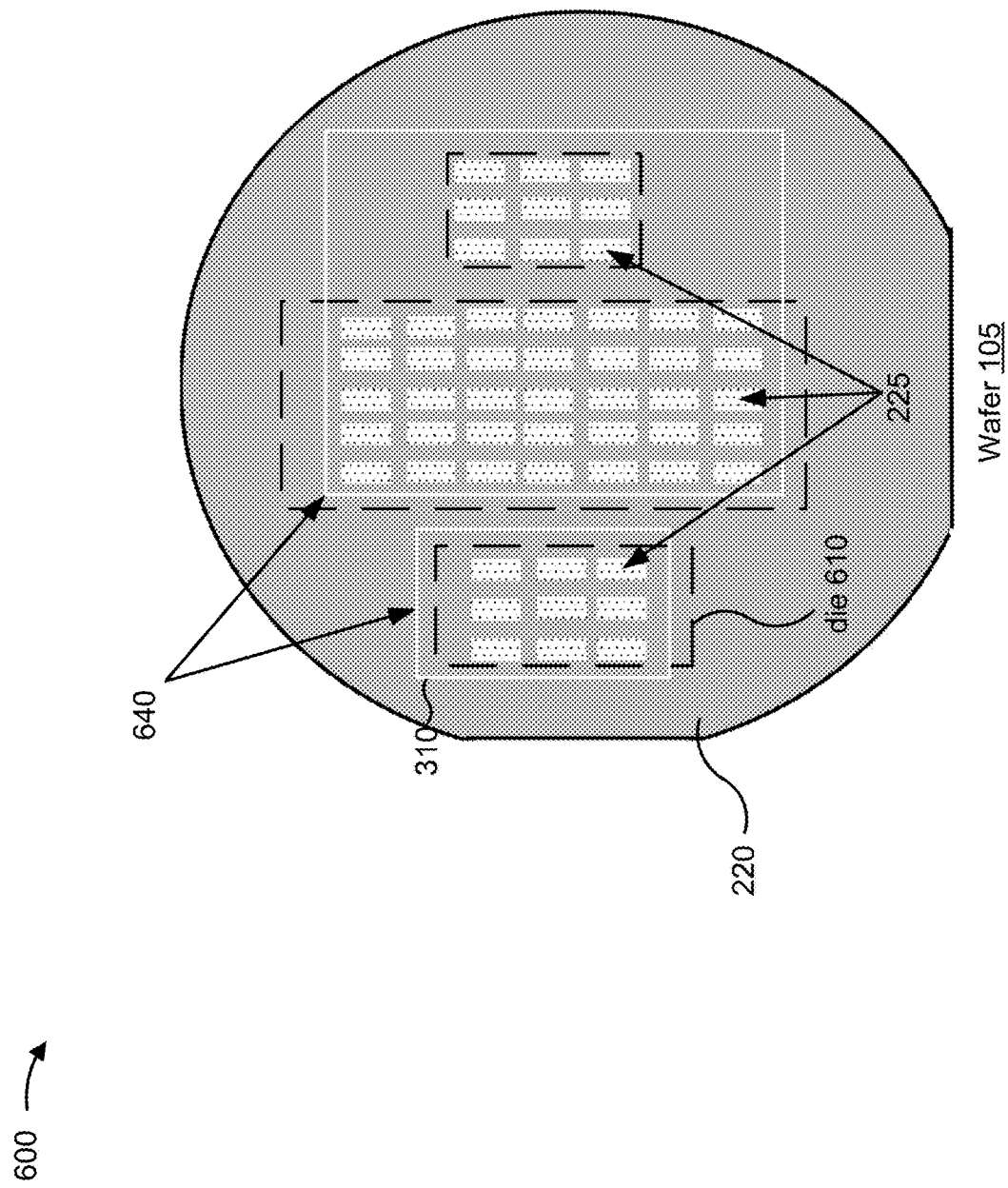

FIGS. 6A-6C are diagrams depicting top-views of example implementations 600 of a wafer that includes trenches for increasing a quantity of reliable chips produced from the wafer. FIGS. 6A-6C show various implementations of trench 310 in relation to a die associated with wafer 105.

As shown in FIG. 6A, wafer 105 may include a set of die 610. A die may be a specific type of chip. For example, die 610 may include a portion of wafer 105 on which an integrated circuit is to be fabricated and that is to be separated from wafer 105. As shown by reference number 620, trench 310 may be located on die 610. For example, trench 310 may be entirely contained on die 610 and may not extend off of die 610. This permits trench 310 to protect active zones 225 from defects and/or dislocations in die 610 after die 610 is separated from wafer 105 (e.g., via dicing of wafer 105), thereby improving a reliability of an integrated circuit formed on die 610. Although trench 310 is shown as a closed shape, in some implementations, trench 310 may not be a closed shape (e.g. a trench may be a multi-segment line or multiple separate lines). For example, trench 310 shown in FIG. 6A may be four separate trenches 310 that form a rectangular shape, with gaps between each of the four trenches 310.

FIG. 6B shows a different configuration of trenches 310 than FIG. 6A. As shown in FIG. 6B, and by reference number 630, trench 310 may surround die 610. For example, trench 310 may surround a single die 610 or multiple die 610. Continuing with the previous example, trench 310 may surround die 610, thereby protecting both die 610 and active zones 225, rather than just protecting active zones 225 as was the case in FIG. 6A, from propagation of a set of defects and/or dislocations in wafer 105. This improves a quality of die 610, relative to having trench 310 be entirely contained on die 610, thereby improving a reliability of an integrated circuit formed on die 610.

FIG. 6C shows a different configuration of trenches 310 from FIGS. 6A and 6B. As shown in FIG. 6C, and by reference number 640, trench 310 may be partially on die 610 and partially off die 610. For example, trench 310 may have been etched on die 610 and off die 610. This permits trench 310 to be used to protect active zones 225 from a set of defects and/or dislocations in wafer 105 and/or to isolate the set of defects and/or dislocations regardless of whether the set of defects and/or dislocations is on die 610, off die 610, or is both on die 610 and off die 610, thereby improving a use of trench 310.

In some implementations, a single trench 310 may be used to form trench 310 shown in FIG. 6C, where the single trench 310 has some portions that are on die 610 and other portions that are off die 610. Conversely, trench 310 shown in FIG. 6C may be comprised of multiple trenches 310 where each of the multiple trenches 310 are either on die 610 or off die 610.

To summarize, trench 310 may be entirely contained on die 610, as described with regard to FIG. 6A, may surround die 610, as described with regard to FIG. 6B, and/or may be partially on die 610 and off die 610, as described with regard to FIG. 6C. Additionally, or alternatively, a single trench 310 may span multiple die 610. Additionally, or alternatively, a single die 610 may contain multiple trenches 310, portions of a set of trenches 310, and/or may not contain any trenches 310.

As indicated above, FIGS. 6A-6C are provided merely as an example. Other examples are possible and may differ from what was described with regard to FIGS. 6A-6C. The heights, widths, and thicknesses of layers and/or features shown in FIGS. 6A-6C are provided as examples, and are exaggerated for illustrative purposes. Further, wafer 105 may include additional layers and/or features, fewer layers and/or features, different layers and/or features, or differently arranged layers and/or features than those shown in FIGS. 6A-6C.

Figure 7:
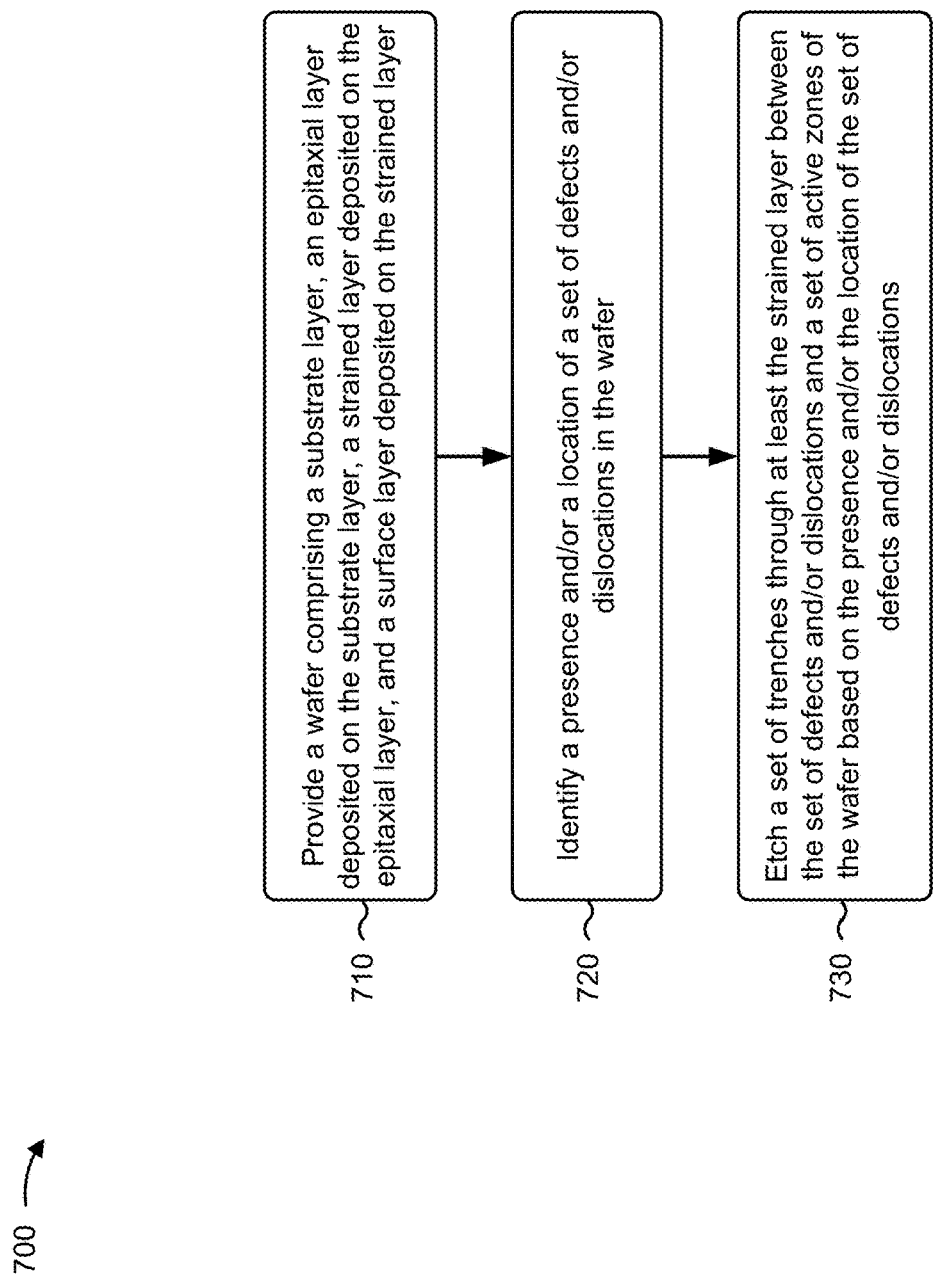
FIG. 7 is a flow chart of an example process for manufacturing a wafer that includes a trench for increasing a quantity of reliable chips from a wafer.

FIG. 7 is a flow chart of an example process 700 for manufacturing a wafer that includes a trench for increasing a quantity of reliable chips produced from the wafer. For example, FIG. 7 shows an example process 700 for manufacturing wafer 105 that includes trench 310. Notably, while example process 700 is described in the context of manufacturing wafer 105 that includes trench 310, the implementations described with respect to process 700 apply equally to other types of wafers and/or other types of trenches for increasing a quantity of reliable chips produced from wafer 105.

As shown in FIG. 7, process 700 may include providing a wafer comprising a substrate layer, an epitaxial layer deposited on the substrate layer, a strained layer deposited on the epitaxial layer, and a surface layer deposited on the strained layer (block 710). For example, process 700 may include providing wafer 105 comprising substrate layer 205, layer 210 deposited on substrate layer 205, strained layer 215 deposited on layer 210, and surface layer 220 deposited on strained layer 215.

In some implementations, wafer 105 may be associated with a light-emitting device. For example, wafer 105 may be associated with a light-emitting diode (LED), a vertical-cavity surface-emitting laser (VCSEL), a vertical external-cavity surface-emitting laser (VECSEL), an edge-emitting laser, and/or the like.

In some implementations, wafer 105 may include a set of defects and/or dislocations. For example, wafer 105 may include a set of defects and/or dislocations that resulted from manufacturing of wafer 105, from mechanical stress caused by strained layer 215, and/or the like. Additionally, or alternatively, a particular portion of wafer 105 may be associated with a threshold likelihood to include a set of defects and/or dislocations, may be associated with a higher likelihood relative to another portion of wafer 105, and/or the like. For example, an edge, or outer, portion of wafer 105 may be associated with a higher likelihood to include a set of defects and/or dislocations relative to a central, or inner, portion of wafer 105.

In some implementations, information identifying a location of a set of defects and/or dislocations in wafer 105 may be used to determine a location for trench 310, as described in more detail elsewhere herein. Additionally, or alternatively, information identifying a portion of wafer 105 that has a threshold likelihood to include a set of defects and/or dislocations, and/or that has a higher likelihood relative to another portion of wafer 105, may be used to determine a location for trench 310, as described in more detail elsewhere herein.

In this way, wafer 105 may be provided prior to identifying a presence and/or a location of a set of defects and/or dislocations in wafer 105.

As further shown in FIG. 7, process 700 may include identifying a presence and/or a location of a set of defects and/or dislocations in the wafer (block 720). For example, process 700 may include identifying a presence and/or a location of a set of defects and/or dislocations in wafer 105.

In some implementations, a technique may be used to identify a presence and/or a location of a set of defects and/or dislocations in wafer 105. For example, a characterization technique may be used to identify a presence and/or a location of a set of defects and/or dislocations in wafer 105. As a specific example, a photoluminescence technique may be used to identify a presence and/or a location of a set of defects and/or dislocations in wafer 105. Continuing with the previous example, wafer 105 may be illuminated with light capable of generating photoluminescence from wafer 105. Continuing still with the previous example, a set of defects and/or dislocations in wafer 105 may generate photoluminescence in a manner different than portions of wafer 105 that do not include a set of defects and/or dislocations. This permits quick and easy identification of a presence and/or location of defects and/or dislocations in wafer 105.

Additionally, or alternatively, and as another specific example, a polarimetry imaging technique may be used to identify a presence and/or a location of a set of defects and/or dislocations. Continuing with the previous example, a polarimetry imaging technique may be applied using a wavelength at which wafer 105 is transparent. Continuing still with the previous example, when using a polarimetry imaging technique, a set of defects and/or dislocations in wafer 105 may generate a stress field that modifies a local index of refraction, which can be used to identify a presence and/or a location of the set of defects and/or dislocations in wafer 105. This permits quick and easy identification of a presence and/or a location of a set of defects and/or dislocations in wafer 105.

In some implementations, a device may be used to automatically identify a presence and/or a location of a set of defects and/or dislocations in wafer 105. For example, a device may be used to identify a presence and/or a location of a set of defects and/or dislocations in wafer 105 based on detecting variations in photoluminescence and/or polarization of wafer 105. Additionally, or alternatively, and as another example, a device may capture an image of photoluminescence and/or polarization of wafer 105 and may process the image using an image processing technique (e.g., a computer vision technique, a pattern recognition technique, a shape detection technique, etc.) to identify a presence and/or a location of a set of defects and/or dislocations in wafer 105.

In some implementations, identification of a presence and/or a location of a set of defects and/or dislocations in wafer 105 may include identifying a portion of wafer 105 that includes a threshold quantity of defects and/or dislocations. For example, identification of a presence and/or a location of a set of defects and/or dislocations in wafer 105 may include identifying a portion of wafer 105 that includes a threshold quantity of defects and/or dislocations in a threshold size area of wafer 105, in a particular area of wafer 105 (e.g., an edge, or outer, area of wafer 105), and/or the like.

Additionally, or alternatively, block 720 may include identifying a portion of wafer 105 that is associated with a threshold likelihood of including a set of defects and/or dislocations, of including a threshold quantity of defects and/or dislocations, and/or the like. For example, identification of a portion of wafer 105 that is associated with a threshold likelihood may be based on historical data related to defects and/or dislocations in wafer 105, based on a size and/or shape of wafer 105, based on materials included in wafer 105, based on types, thicknesses, etc. of layers of wafer 105, and/or the like. This may reduce or eliminate a need to use a technique to identify a presence and/or a location of a set of defects and/or dislocations in wafer 105, thereby improving an efficiency of manufacturing wafer 105, reducing a cost associated with wafer 105, conserving resources that would otherwise be used for the technique, and/or the like.

In some implementations, block 720 may include identifying whether a set of defects and/or dislocations is present in active zone 225. For example, block 720 may include identification of whether a set of defects and/or dislocations is present in active zone 225 prior to etching trench 310 in wafer 105, prior to depositing particular layers of wafer 105, and/or the like, such as to permit wafer 105 to be discarded prior to further processing of wafer 105. In some implementations, a set of defects and/or dislocations present in active zone 225 may reduce a quantity of usable or reliable chips that can be produced from wafer 105, may be associated with a threshold likelihood that a chip produced from wafer 105 will fail (e.g., within a threshold amount of time of being used), and/or the like.

In some implementations, wafer 105 that includes a set of defects and/or dislocations in active zone 225 (or a threshold quantity of defects and/or dislocations in active zone 225) may be discarded (e.g., prior to etching trench 310, prior to producing a chip from wafer 105, depositing particular layers of wafer 105, etc.). This conserves resources that would otherwise be consumed by further manufacturing wafer 105, etching trench 310, and/or producing a chip from wafer 105, thereby increasing an efficiency of manufacturing wafer 105, reducing a cost of manufacturing wafer 105, etc. relative to using a process that does not include determining whether active zone 225 includes a set of defects and/or dislocations.

In this way, a presence and/or a location of a set of defects and/or dislocations in wafer 105 may be identified prior to etching a set of trenches 310 in wafer 105.

As further shown in FIG. 7, process 700 may include etching a set of trenches through at least the strained layer between the set of defects and/or dislocations and a set of active zones of the wafer based on the presence and/or the location of the set of defects and/or dislocations (block 730). For example, a set of trenches 310 may be etched through at least strained layer 215 between the set of defects and/or dislocations and a set of active zones 225 of wafer 105 based on the presence and/or location of the set of defects and/or dislocations.

In some implementations, a set of trenches 310 may be etched using an etching technique. For example, a set of trenches 310 may be etched using a wet etching technique where a liquid etchant is used to etch the set of trenches 310. Additionally, or alternatively, and as another example, a set of trenches 310 may be etched using a dry etching technique (e.g., a plasma etching technique where a stream of plasma is used to etch the set of trenches 310). In some implementations, wafer 105 may include some trenches 310 that were etched using a wet etching technique and other trenches 310 that were etched using a dry etching technique. In some implementations, a single trench 310 may be etched using both a wet etching technique and a dry etching technique. For example, a first portion of trench 310 (e.g., a curved portion) may be etched using a dry etching technique and a second portion of trench 310 (e.g., a straight portion that follows a crystallographic direction) may be etched using a wet etching technique.

In some implementations, a set of trenches 310 may be etched such that the set of trenches 310 extends around active zone 225. For example, a set of trenches 310 may be etched such that the set of trenches 310 extends in a manner similar to that described above with respect to reference numbers 410 and/or 430. Additionally, or alternatively, a set of trenches 310 may be etched such that the set of trenches 310 isolates a portion of wafer 105 from active zone 225. For example, a set of trenches 310 may extend such that the set of trenches 310 isolates a portion of wafer 105 that includes a threshold quantity of defects and/or dislocations and/or that is associated with a threshold likelihood of including a set of defects and/or dislocations. Continuing with the previous example, a set of trenches 310 may be etched such that the set of trenches 310 extends in a manner similar to that described above with respect to reference number 420.

In some implementations, a set of trenches 310 may be etched through a set of layers of wafer 105. For example, a set of trenches 310 may be etched through surface layer 220 (when present) and strained layer 215. Alternatively, and as another example, a set of trenches 310 may be etched through surface layer 220 (when present), strained layer 215, and layer 210. In this way, a set of trenches 310 may be etched through at least strained layer 215, thereby reducing or eliminating a lateral propagation of a defect and/or dislocation through strained layer 215 at the location of the set of trenches 310.

In some implementations, trench 310 may be etched such that trench 310 has a depth within a range of values. For example, trench 310 may be etched to a depth of between approximately one micron and six microns. In some implementations, a depth to which trench 310 is etched may depend on an etching technique used to etch trench 310, a layer of wafer 105 through which trench 310 is etched, a thickness of layers of wafer 105, types of layers included in wafer 105, and/or the like. For example, when trench 310 extends through strained layer 215, trench 310 may have a depth of approximately one micron. Alternatively, and as another example, when trench 310 extends through layer 210, trench 310 may have a depth of approximately six microns.

In some implementations, trench 310 may be etched such that trench 310 has a width within a range of values. For example, trench 310 may be etched such that trench 310 has a width between approximately one micron and 20 microns. In some implementations, a width of trench 310 may depend on a depth of trench 310, an etching technique used to etch trench 310, and/or the like. For example, trench 310 that extends to a depth of five microns may be wider relative to another trench 310 that extends to a depth of one micron.

In some implementations, a single trench 310 on wafer 105 may be etched to a combination of depths and/or widths. For example, a first portion of trench 310 may be etched to a first depth and/or width, and a second portion of trench 310 may be etched to a second depth and/or width. Additionally, or alternatively, a single wafer 105 may include multiple trenches 310 etched to different depths and/or widths. For example, a first trench 310 on wafer 105 may be etched to a first depth and/or width and a second trench 310 on wafer 105 may be etched to a second depth and/or width. In this way, trench 310 may be dynamically etched to various depths and/or widths depending on a layer within which a defect and/or dislocation is located, to accommodate variations in thickness of a layer of wafer 105, and/or the like, thereby improving trench 310 relative to another trench 310 that extends to a uniform depth and/or width.

In some implementations, a set of trenches 310 may be etched such that the set of trenches 310 extends in various directions and/or manners. For example, a set of trenches 310 may be etched such that the set of trenches 310 extends in a crystallographic direction, extends in a direction other than a crystallographic direction, extends in a curved or non-linear manner, extends in a linear manner, and/or the like In some implementations, a location at which a set of trenches 310 is to be etched may be determined prior to etching the set of trenches 310. For example, a location at which a set of trenches 310 is to be etched may be determined based on a location of a set of defects and/or dislocations in wafer 105 (e.g., based on whether the set of defects and/or dislocations is a threshold distance from active zone 225, an etching technique to be used to etch the set of trenches 310 (e.g., a particular etching technique may need to be applied to wafer 105 a threshold distance from active zone 225 to reduce or eliminate a risk of damage to active zone 225 from application of the etching technique), whether multiple defects and/or dislocations are concentrated in a particular portion of wafer 105, whether a set of defects and/or dislocations is on die 610 or off die 610, an amount of wafer 105 to be removed to manufacture die 610, and/or the like.

In some implementations, a location for a set of trenches 310 may be a threshold distance from active zone 225. For example, a location for a set of trenches 310 may be a threshold ambipolar diffusion length from active zone 225. In some implementations, the threshold given by the ambipolar diffusion length may be approximately 5 to 10 microns. This reduces or eliminates damage to active zone 225 that may result from etching a set of trenches 310, thereby increasing a quantity of reliable chips that can be produced from wafer 105.

In some implementations, determining a location for a set of trenches 310 may include determining whether to etch the set of trenches 310 around active zone 225. For example, a location for a set of trenches 310 may be determined based on whether a threshold quantity of defects and/or dislocations is present in wafer 105, a concentration of a set of defects and/or dislocations in wafer 105 satisfying a threshold, whether a set of defects and/or dislocations is a threshold distance from active zone 225, and/or the like.

Additionally, or alternatively, a location for a set of trenches 310 may include determining whether to etch the set of trenches 310 such that the set of trenches 310 isolates a portion of wafer 105 (e.g., a portion that includes a set of defects and/or dislocations) from active zone 225. For example, a set of trenches 310 may be determined to be etched to isolate a portion of wafer 105 based on the portion including a threshold quantity of defects and/or dislocations, based on the portion having a threshold concentration of defects and/or dislocations, based on the portion being a threshold distance from active zone 225, based on the portion being associated with a threshold likelihood of including a set of defects and/or dislocations, and/or the like. In this way, a portion of wafer 105 may be isolated from another portion of 105 to reduce or eliminate a propagation of a set of defects and/or dislocations in the portion of wafer 105 to the other portion of wafer 105 (e.g., another portion that includes active zone 225).

In this way, a set of trenches 310 may be etched through at least strained layer 215 between the set of defects and/or dislocations and a set of active zones 225.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Some implementations, described herein, provide a wafer that includes one or more trenches to reduce or eliminate defect and/or dislocation propagation through an active zone of the wafer. In this way, a quantity of reliable chips produced from a wafer may be increased. This increases yield associated with chip production, reduces loss associated with chip production, increases a reliability of a chip produced, and/or reduces costs associated with chip production, thereby improving chip production.

Although wafer 105 is described as having a set of deposited layers, in some implementations, layers of wafer 105 may be fabricated in another manner, such as by being grown, formed, chemically reacted, sprayed, and/or the like. In addition, although some implementations are described with respect to active zone 225, the implementations apply equally to a portion of wafer 105 to be used as active zone 225.

The foregoing disclosure provides illustration and description, but is not intended to be exhaustive or to limit the implementations to the precise form disclosed. Modifications and variations are possible in light of the above disclosure or may be acquired from practice of the implementations.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A wafer, comprising:
a substrate layer;
a set of epitaxial layers deposited on the substrate layer,
the set of epitaxial layers including a strained layer,
the strained layer including one or more active zones; and
one or more trenches between one or more defects or dislocations in the wafer and the one or more active zones,
wherein the one or more trenches extend through at least the strained layer and have a depth between one micron and six microns,
wherein at least one of the one or more trenches does not extend through the one or more active zones, and
wherein the one or more trenches are to prevent propagation of the one or more defects or dislocations into the one or more active zones.

2. The wafer of claim 1, wherein the one or more trenches are etched into one or more layers on which the strained layer is deposited.

3. The wafer of claim 1, wherein the one or more trenches are etched into the substrate layer.

4. The wafer of claim 1, wherein the one or more trenches surround the one or more active zones.

5. The wafer of claim 1, wherein the one or more trenches are not closed shapes.

6. The wafer of claim 1, wherein a subset of the one or more trenches are contained on a die associated with the wafer, or are surrounding the die associated with the wafer.

7. The wafer of claim 1, wherein a subset of the one or more trenches are not contained on a die associated with the wafer or do not surround the die associated with the wafer.

8. The wafer of claim 1, wherein the one or more trenches isolate the one or more defects or dislocations to one or more portions of the wafer.

9. The wafer of claim 1, wherein the one or more trenches extend in one or more directions that are different than one or more crystallographic directions of the wafer.

10. A method, comprising:
providing a wafer,
wherein the wafer comprises:
a substrate layer, and
a set of epitaxial layers deposited on the substrate layer,
wherein the set of epitaxial layers includes a strained layer,
wherein the strained layer includes a set of active zones to be used to generate optical gain;
identifying a presence or a location of a set of defects or dislocations in the wafer; and
etching a set of trenches through at least the strained layer,
wherein at least one trench of the set of trenches does not extend through the set of active zones,
wherein the set of trenches have a depth between one micron and six microns, and
wherein the set of trenches is etched between the set of defects or dislocations and the set of active zones based on the presence or the location of the set of defects or dislocations.

11. The method of claim 10, further comprising:
identifying a set of locations at which to etch the set of trenches,
wherein the set of locations is a threshold distance from the set of defects or dislocations; and
wherein etching the set of trenches comprises:
etching the set of trenches after identifying the set of locations at which to etch the set of trenches.

12. The method of claim 10, further comprising:
determining to etch the set of trenches around the set of active zones based on the presence or the location of the set of defects or dislocations; and
wherein etching the set of trenches comprises:
etching the set of trenches after determining to etch the set of trenches around the set of active zones.

13. The method of claim 10, further comprising:
determining to etch the set of trenches to isolate the set of defects or dislocations based on the presence or the location of the set of defects or dislocations; and
wherein etching the set of trenches comprises:
etching the set of trenches after determining to etch the set of trenches to isolate the set of defects or dislocations.

14. The method of claim 10, wherein etching the set of trenches comprises:
etching the set of trenches in a direction that is different than a crystallographic direction of the wafer.

15. The method of claim 10, wherein etching the set of trenches comprises:
etching the set of trenches into the substrate layer.

16. A light-emitting device, comprising:
a set of layers comprising:
a substrate layer, and
a set of epitaxial layers deposited on the substrate layer,
wherein the set of epitaxial layers includes a strained layer;
wherein the strained layer includes a set of active zones to be used to generate optical gain; and
a set of trenches etched into a subset of the set of layers of the light-emitting device,
wherein at least one trench of the set of trenches does not extend through the set of active zones,
wherein the set of trenches have a depth between one micron and six microns, and
wherein the set of trenches is to prevent a set of defects or dislocations in a wafer from which the light-emitting device was formed from propagating into the set of active zones.

17. The light-emitting device of claim 16, wherein the set of trenches extends in a set of directions that does not follow crystallographic directions of the light-emitting device.

18. The light-emitting device of claim 16, wherein a subset of trenches extends around a subset of active zones.

19. The light-emitting device of claim 16, wherein a subset of trenches isolates the set of defects or dislocations.

20. The light-emitting device of claim 16, wherein a subset of trenches extends through the strained layer, or into the substrate layer.

* * * * *